United States Patent [19]

Okamura

[11] Patent Number: 5,483,685
[45] Date of Patent: Jan. 9, 1996

[54] QUICK CHANNEL SELECTION SYSTEM FOR BROADCAST AREAS HAVING SMALL NUMBER OF ACTIVE CHANNELS

[75] Inventor: Masahiko Okamura, Osaka, Japan

[73] Assignee: Matsushita Electric Industrial Co., Ltd., Osaka, Japan

[21] Appl. No.: 259,425

[22] Filed: Jun. 14, 1994

[30] Foreign Application Priority Data

Jun. 18, 1993 [JP] Japan .................................. 5-147331

[51] Int. Cl.⁶ .............................. H04N 5/50; H04B 1/16
[52] U.S. Cl. .................... 455/179.1; 455/181.1; 455/186.2; 348/731
[58] Field of Search ............................ 455/150.1, 151.1, 455/154.1, 161.1, 179.1, 180.1, 181.1, 185.1, 186.1, 186.2, 197.1; 348/731, 570; H04N 5/50, 5/44

[56] References Cited

U.S. PATENT DOCUMENTS 4,279,035  7/1981  Skerlos ............................. 455/186.2 X
4,527,194  7/1985  Sirazi ................................. 348/731 X
4,737,993  4/1988  DeVilbiss ............................. 455/180.1

FOREIGN PATENT DOCUMENTS 1246972  3/1988  Japan .

*Primary Examiner*—Chi H. Pham
*Attorney, Agent, or Firm*—Panitch Schwarze Jacobs & Nadel

[57] ABSTRACT

In a receiver having a channel selection apparatus which is capable of receiving channels of the number of three digits, when the receiver is used in a zone having channels of the number of two digits or the number of one digit, a reference counting value corresponding to digits of the number of the channels is set in a counter. Counting operation of the counter is changed by changing the reference counting value and a channel selection time of a channel in the number of two digits or the number of one digit is reduced.

3 Claims, 1 Drawing Sheet

QUICK CHANNEL SELECTION SYSTEM FOR BROADCAST AREAS HAVING SMALL NUMBER OF ACTIVE CHANNELS

FIELD OF INVENTION AND RELATED ART STATEMENT

1. Field of the Invention

The present invention relates generally to a channel selection apparatus of a receiver, and more particularly to a channel selection apparatus of a television receiver or the like for selecting a broadcasting channel from many broadcasting channels of one hundred or more.

2. Description of the Related Art

In a recent television broadcasting system and a community antenna television system (in general abbreviated as CATV), various programs are broadcasted through several hundred channels. A receiver for receiving such broadcasts is provided with a channel selection apparatus which is capable of selecting a target channel from a large number of channels, several hundreds for example. In the channel selection apparatus, it is not practical to install a selection switch with several hundred connection contacts which one-to-one correspond to the several hundred channels.

In a conventional channel selection apparatus, a ten-key device having ten numbered-keys of "0", "1", "2", "3", "4", "5", "6", "7", "8" and "9" is utilized and a numerical value which is inputted with the ten-key device is made to correspond to a "channel number" from zero number to a maximum number of the channel number. For example, in the case of selecting a channel number "356", the numbered-keys "3", "5" and "6" of the ten-key device are pressed in the named order, and the channel number "356" is selected.

In the ten-key device as mentioned above, it is necessary to provide a function to determine whether or not a target channel is a channel number "3", a channel number "35" or a channel number "356". Without provision of such function in the ten-key device, when an operator presses a numbered-key "3" intending to select the channel number "356", the channel number "3" is selected contrary to his intention. Therefore, the operator can not select the channel number "35" or the channel number "356". In order to prevent such unfavorable action, a function which will be explained hereafter is comprised in the channel selection apparatus.

In channel selection operation of the channel number "356", for example, (1) First, the operator presses the numbered-key "3" of the hundreds digit. After the numbered-key "3" has been pressed, channel selection operation of the channel selection apparatus is delayed by a predetermined time length (hereinafter is referred to as selection lag-time T) to detect pressing of a successive numbered-key "5" of the tens digit.

(2) When the next numbered-key "5" is not pressed during the selection lag-time T, it is determined that a channel number "3" is a target channel, and the channel number "3" is selected.

(3) When the numbered-key "5" of the tens digit is pressed during the selection lag-time T by the operator, the channel selection operation is further delayed by the selection lag-time T to detect pressing a successive numbered-key of the units digit.

(4) When the next numbered-key "6" is not pressed during the selection lag-time T, it is determined that a channel number "35" is the target channel, and the channel number "35" is selected.

(5) When the numbered-key "6" of the units digit is pressed during the selection lag-time T, it is immediately determined that the channel number "356" is the target channel, and the channel number "356" is selected. The above-mentioned selection lag-time T is set to 2.3 seconds, for example, as a matter of convenience.

When the target channel number is a numerical value of three digits, the selection lag-time T does not give any harmful influence to the channel selection operation by the operator. However, when the target channel number is a numerical value of two digits or a numerical value of one digit, there is inconvenience in the channel selection operation as described below.

For example, in the case of the target channel number "3", the channel selection operation of the channel selection apparatus is activated after 2.3 seconds from pressing the numbered-key "3" of the ten-key device. Namely, reception of a program of the channel number "3+ starts after 2.3 seconds from pressing the numbered-key "3". Channel selection operation for selecting the channel number "35" of the number of two digits is similar to that of the case of selecting the channel number "3". Therefore, when the operator selects a channel number of one digit or a channel number of two digits, reception of program starts after 2.3 seconds from pressing operation of the last numbered-key. Consequently, the operator must be waiting for 2.3 seconds every time when he have selected a channel number of one digit or two digits. Particularly, in the case that a television receiver which can receive broadcasting channels of the number of three digits is used in a zone having broadcasting channels of the number of two digits or the number of one digit, the operator must wait for the above-mentioned selection lag-time T every channel selection operation. Therefore, the selection lag-time T makes the channel selection operation dull and unhandy.

OBJECT AND SUMMARY OF THE INVENTION

An object of the present invention is to provide a channel selection apparatus which can select rapidly a target channel number of the number of one digit or the number of two digits in a receiver which is capable of receiving channels of the number of three digits.

The channel selection apparatus of the receiver in accordance with the present invention comprising:

channel search means for detecting broadcasting channels by search operation through a predetermined broadcasting band, reference counting value setting means for outputting a numerical value corresponding to a digit of the number of broadcasting channels detected by the channel search means, ten-key means comprising at least ten numbered-keys for outputting numerical data corresponding to the numbered-keys and an operation signal generated upon operation of one of the ten numbered-keys, counter means which receives the numerical value corresponding to the digit output from the reference counting value setting means for setting the numerical value for a reference counting value for counting input of the operation signal inputted from the ten-key means, compares the number of the operation signal with the reference counting value, and outputs a coincidence signal when the number of the operation signal coincides with the reference counting value, timer means for measuring a time length by inputting the operation signal of the ten-key means and outputting a time measurement completion signal after completion of the measurement of the time, memory means for storing the numerical data output from the ten-key means and for outputting the stored numerical data by inputting of one of the coincidence signal output from the counter means and the time measurement completion signal output from the timer means, and channel selection signal generation means for generating a channel selection signal corresponding to the numerical data inputted from the memory means.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF THE PREFERRED EMBODIMENTS

Figure 1:
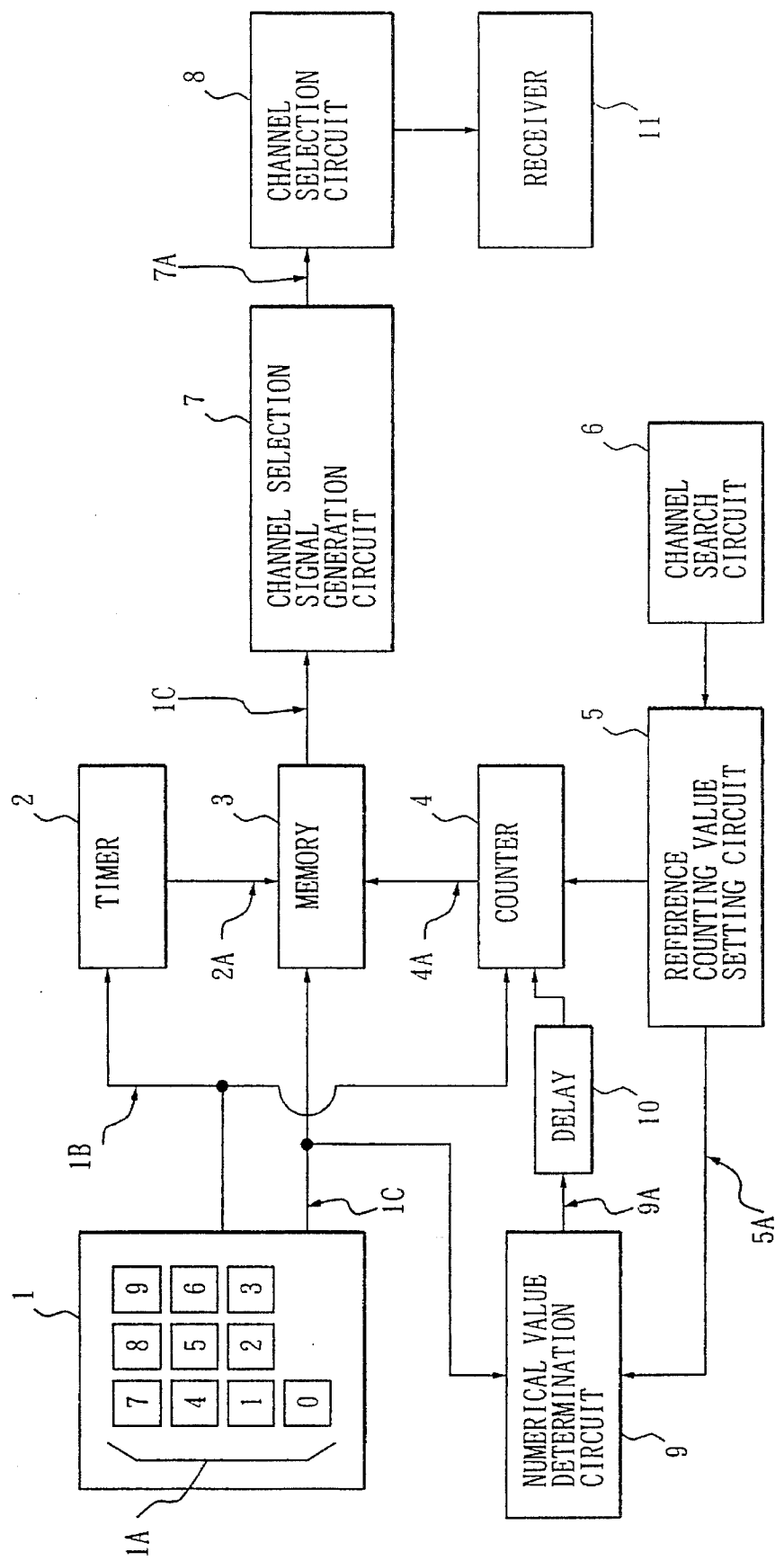
FIG. 1 is a block diagram of a channel selection apparatus of a receiver of an embodiment of the present invention.

FIG. 1 is a block diagram of a channel selection apparatus of a receiver of an embodiment of the present invention. Referring to FIG. 1, a ten-key device 1 comprises ten-key switches of a known type, and "numerical data 1C" corresponding to numbered-keys 1A of numerals "0", ..., "9" are output by pressing the numbered-keys 1A. The numerical data 1C output from the ten-key device 1 are applied to a memory 3 and is stored therein. Moreover, one discrete pulse-like "operation signal 1B" is output from the ten-key device 1 by pressing a numbered-key 1A, and is applied to a timer 2 and a counter 4. The timer 2 starts time measurement operation by inputting the operation signal 1B, and after a predetermined duration (selection lag-time T), a "time measurement completion signal 2A" is output to the memory 3. The selection lag-time T is about 2.3 seconds, for example, and is equal to the selection lag-time T in the description of the related art.

The counter 4 counts input of the operation signal 1B, and a counted value of the counter 4 increases by one at input of one operation signal 1B. In the counter 4, a "reference counting value" is set by a reference counting value setting circuit 5 in advance. The reference counting value is "3", "2" or "1", and one of three reference counting values is set in the counter 4 by the reference counting value setting circuit 5. In the case of the reference counting value "3", a channel number to be selected by the channel selection apparatus is in a range from the channel number "0" to a maximum channel number of the hundreds digit. When the reference counting value "2", a channel number to be selected is in the range from the channel number "0" to the channel number "99", furthermore, in the case of the reference counting value "1", a channel number to be selected is in the range from the channel number "0" to the channel number "9".

The reference counting value is derived in the reference counting value setting circuit 5 on the basis of the number of channels detected by a channel search circuit 6. The channel search circuit 6 comprises a known band sweep circuit by which a predetermined frequency band is swept. The reference counting value setting circuit 5 comprises a counter, and counts the number of channels detected by the channel circuit 6. Subsequently, the digit of the number of channels counted by the counter is determined, and a reference counting value corresponding to the digit is set to the counter 4.

The operation of the reference counting value setting circuit 5 is described hereafter. The reference counting values based on the following determination results (1), (2), (3) and (4) are output in accordance with the number of channels detected by the channel search circuit 6:

(1) the number of channels is 9 and below, (2) the number of channels is larger than 9 and is smaller than 100, (3) the number of channels is larger than 99 and is smaller than 200, (4) the number of channels is 200 or more.

In the case of the determination result (1), the reference counting value "1" is set to the counter 4 by the reference counting value setting circuit 5. In the case of the determination result (2), the reference counting value "2" is set to the counter 4. In the case of the determination result (3), the reference counting value "3" is set to the counter 4, and a "numerical value determination signal 5A" is output from the reference counting value setting circuit 5. The numerical value determination signal 5A is applied to a numerical value determination circuit 9. In the case of the determination result (4), the reference counting value "3" is set to the counter 4.

In the numerical value determination circuit 9, the numerical data 1C output from the ten-key device 1 is determined whether the numerical data 1C is "1" or not, or whether one of the numerical data 1C of "0", "2", "3", "4", "5", "6", "7", "8" and "9" or not. In the state that the numerical value determination signal 5A is applied to the numerical value determination circuit 9, when one of the numerical data 1C of "0", "2", "3", "4", "5", "6", "7", "8" and "9" is applied to the numerical value determination circuit 9 from the ten-key device 1, the numerical value determination circuit 9 outputs an "output signal 9A" to terminate counting operation of the counter 4. The output signal 9A is applied to the counter 4 through a delay circuit 10 to delay the output signal 9A by a predetermined time length, 0.1 seconds for example. On the other hand, the output signal 9A is not output when the numerical data 1C of "1" is inputted to the numerical value determination circuit 9. After the numerical data 1C of "1" have been applied to the numerical value determination circuit 9, the numerical value determination circuit 9 is locked, and operation of the numerical value determination circuit 9 is not activated until new selection operation is started.

When the counted value of the counter 4 is in coincidence with the reference counting value set in the reference counting value setting circuit 5, a "coincidence signal 4A" is output from the counter 4. The coincidence signal 4A is applied to the memory 3. When any one of the time measurement completion signal 2A output from the timer 2 and the coincidence signal 4A output from the counter 4 is inputted to the memory 3, the numerical data 1C stored in the memory 3 is applied to a channel selection signal generation circuit 7. In the channel selection signal generation circuit 7, a "selection signal 7A" for selecting a channel to be received by the receiver is generated on the basis of the inputted numerical data 1C and is applied to a channel selection circuit 8. Consequently, the target channel is selected and is received by a receiver 11.

Hereafter, actual operation of the channel selection apparatus is described. In the case that the number of channels detected by the channel search circuit 6 is the hundreds digit which are 200 or more, for example 400, the detected channels are numbered from "0" to the maximum number "400". Consequently, the reference counting value "3" is set to the counter 4 by the reference counting value setting circuit 5.

Provided that a target channel number is "365", a first numbered-key "3" of the hundreds digit is pressed in the ten-key device 1 by the operator, and the numerical data 1C of "3" is stored in the memory 3. Additionally, the operation signal 1B generated by pressing the numbered-key 1A is applied to the timer 2, and the time measuring operation is started. Moreover, the operation signal 1B is applied to the counter 4, and the counted value of the counter 4 turns "1". In this state, after the selection lag-time T have elapsed without pressing successive numbered-key, the channel number "3" is selected.

When the successive numbered-key "6" is pressed before elapse of the selection lag-time T of the timer 2, the numerical data 1C of "6" is stored in the memory 3, and the stored numerical data turns "36". Moreover, the operation signal 1B is applied to the timer 2 and the counter 4, and the time measuring operation of the timer 2 is started. On the other hand, the counted value in the counter 4 turns "2". In this state, after elapse of the selection lag-time T without pressing the successive numbered-key, the channel number "36" is selected.

When the successive numbered-key "5" is pressed before elapse of the selection lag-time T of the timer 2, the numerical data 1C of "5" is stored in the memory 3, and the stored numerical data 1C turns "365". Moreover, the operation signal 1B is applied to the timer 2 and the counter 4, and the time measuring operation of the timer 2 is started, and the counted value of the counter 4 turns "3". Consequently, since the counted value "3" is in coincidence with the reference counting value "3" set in the counter 4, and the coincidence signal 4A is output from the counter 4 and is applied to the memory 3. By the input of the coincidence signal 4A, the stored numerical data "365" in the memory 3 is immediately applied to the channel selection signal generation circuit 7.

In the case that the number of channels is larger than 99 and is smaller than 200 (above-mentioned determination result (3)), the numerical value determination signal 5A is applied to the numerical value determination circuit 9. In this case, provided that a target channel number is "57" of the number of two digits which is larger than 9 and is smaller than 100, first, the numbered-key "5" is pressed. When the numerical data 1C of "5" is applied to the numerical value determination circuit 9, the output signal 9A is output, and is applied to the counter 4 through the delay circuit 10. Prior to the input of the output signal 9A to the counter 4, the operation signal 1B output from the ten-key device 1 by operation of the numbered-key "5" is applied to the counter 4, and the counted value of the counter 4 turns "1". Therefore, the counted value of the counter 4 results in "2" by the input of the output signal 9A. Subsequently, when the numbered-key "7" is pressed, the counted value of the counter 4 turns "3", and the coincidence signal 4A is applied to the memory 3 from the counter 4. Consequently, the numerical data of "57" stored in the memory 3 is applied to the channel selection signal generation circuit 7, and a signal for selecting the channel number "57" is output to the channel selection circuit 8. As mentioned above, a time for selecting the channel number of two digits is reduced in the case that the number of channels is larger than 99 and is smaller than 200.

On the other hand, provided that the target channel number is "156" of the number of three digits, first, the numbered-key "1" is pressed, therefore the output signal 9A is not output from the numerical value determination circuit 9. The counted value of the counter 4 turns "1" by input of the operation signal 1B generated by operation of the first numbered-key "1". Further operation of the numerical value determination circuit 9 is interrupted by input of the numerical data of the numbered-key "1". Subsequently, when the successive numbered-key "5" of the tens digit is pressed, operations of the timer 2, memory 3 and counter 4 are similar to the selection operations of the channel number of the hundreds digit as mentioned above. Since there are many zones having the number of channels which are larger than 99 and smaller than 200 in actual broadcasting systems, the channel selection apparatus configured as mentioned above is very practical.

When the number of channels is a number of two digits which is smaller than 100, the reference counting value "2" is set to the counter 4 by the reference counting value setting circuit 5. When the target channel number is "36", the counted value of the counter 4 turns "1" by operation of the first numbered-key "3", and the numerical data of "3" is stored in the memory 3.

Subsequently, when the numbered-key "6" is pressed, the numerical data of "6" is stored in the memory 3, and the numerical data in the memory 3 turns "36". Moreover, the operation signal 1B is applied to the timer 2 and the counter 4. In the counter 4, the counted value turns "2", and the coincidence signal 4A is immediately applied to the memory 3 because the reference counting value "2" in the counter 4 is in coincidence with the counted value "2". Consequently, the numerical data of "36" stored in the memory 3 is applied to the channel selection signal generation circuit 7. In this case, the channel selection operation is immediately performed without waiting elapse of the selection lag-time T after the numbered-key "6" of the tens digit is pressed. In the case of the target channel number of the units digit, the channel number of the units digit is selected by waiting elapse of the selection lag-time T after the numbered-key has been pressed.

Moreover, in the case that the number of channels detected by the channel search circuit 6 is 9 and below, the reference counting value "1" is set in the counter 4 by the reference counting value setting circuit 5. Therefore, when the first numbered-key 1A of the ten-key device 1 is pressed, the numerical data of 1C the numbered-key "1" is immediately inputted to the channel selection signal generation circuit 7 through the memory 3, and the channel selection operation is performed.

As mentioned above, in the channel selection apparatus of the present invention, in a zone having broadcasting channels of a numerical value of three digits, when a target channel number is the number of three digits, the channel selection operation is immediately performed after pressing the numbered-key 1A of the units digit. Moreover, in a zone having the broadcasting channels of the number of two digits, when a target channel number is the number of two digits, channel selection operation is immediately performed by pressing the numbered-key of the units digit. In a zone having the broadcasting channels of the number of one digit, the channel selection operation is performed by pressing a first numbered-key. The digit of the number of the broadcasting channels is automatically detected by the reference counting value setting circuit 5, accordingly, predetermined channel selection operations is automatically set.

Particularly, in a zone having the broadcasting channels which are larger than 99 and are smaller than 200, when the numbered-key "1" is firstly pressed by the operator, it is determined that the target channel number is the number of three digits. On the contrary, when the numbered-key "1" is not firstly pressed, it is determined that the target channel number is the number of two digits, and the channel selection operation is immediately performed by pressing the successive number key. Therefore, a time required to select a channel is reduced and rapid channel selection operation is realized.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A channel selection apparatus of a receiver comprising:

channel search means for detecting broadcasting channels by conducting a search operation through a predetermined broadcasting band, reference counting value setting means for outputting a numerical value corresponding to the number of digits in the highest broadcasting channel detected by said channel search means, a keyboard comprising at least ten numbered-keys for outputting numerical data corresponding to said numbered-keys and for outputting an operation signal each time a key is selected, counter means, connected to said reference counting value setting means and said keyboard, for receiving said numerical value from said reference counting value setting means, setting said numerical value as a reference counting value, storing the number of operation signals received from the keyboard as an incrementing count value, comparing said incrementing count value with said reference counting value, and outputting a coincidence signal when said incrementing count value coincides with said reference counting value, timer means for measuring a time length after each input of an operation signal from said keyboard and outputting a time measurement completion signal after completion of said time length, memory means for storing said numerical data output from said keyboard and for outputting said stored numerical data in response to one of said coincidence signal output from said counter means and said time measurement completion signal output from said timer means, and channel selection signal generation means, connected to said memory means, for generating a channel selection signal corresponding to said numerical data output from said memory means.

2. A channel selection apparatus of a receiver in accordance with claim 1, further comprising channel selection means, connected to said channel selection signal generation means, for selecting a channel to be received on the basis of the channel selection signal generated by said channel selection signal generation means.

3. A channel selection apparatus of a receiver in accordance with claim 1, wherein said reference counting value setting means outputs a numerical value determination signal when the number of channels detected by said channel search means is larger than 99 and is smaller than 200, the apparatus further comprising:

numerical value determination means operable upon receipt of the numerical value determination signal for incrementing said count value by one only if the first key selected on the keyboard is one of numerals "0", "2", "3", "4", "5", "6", "7", "8" and "9", the incrementing of said count value being in addition to the incrementing caused by the operation signal corresponding to the selection of the first key.

* * * * *